Sept. 29, 1959 J. R. HARRIS 2,906,894
BINARY COUNTER
Filed Nov. 29, 1957
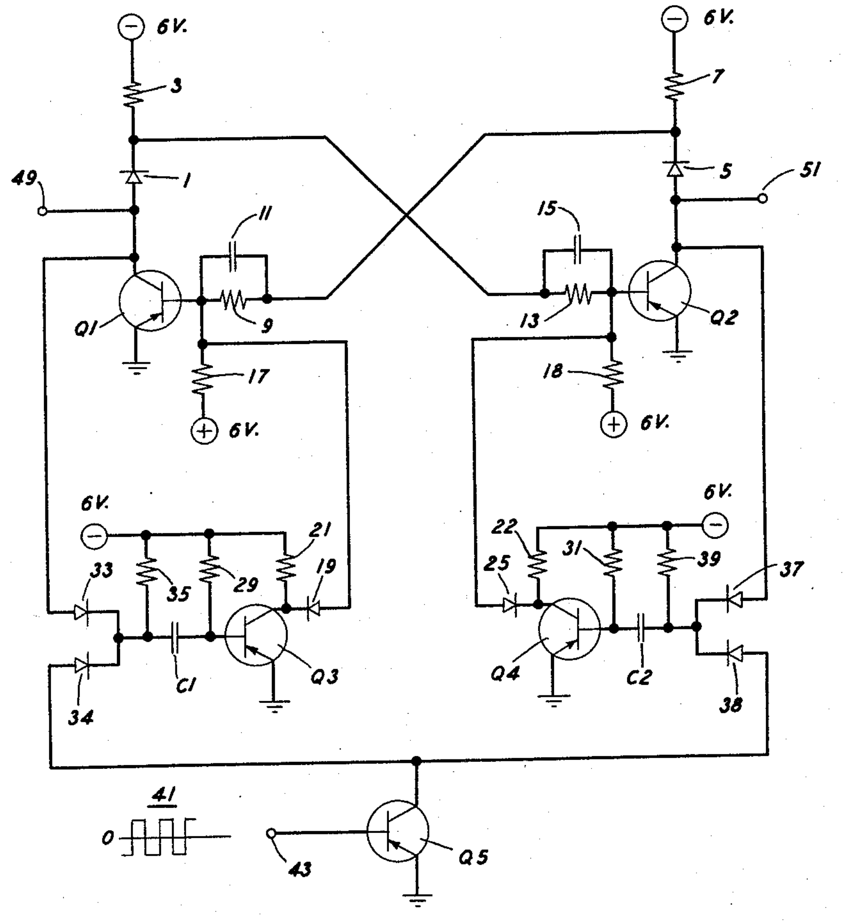
INVENTOR
J. R. HARRIS
BY Walter M. Hill
ATTORNEY United States Patent Office 2,906,894

Patented Sept. 29, 1959

2,906,894

BINARY COUNTER

James R. Harris, Morristown, N.J., assignor to Bell Telephone Laboratories, Incorporated, New York, N.Y., a corporation of New York Application November 29, 1957, Serial No. 699,605

4 Claims. (Cl. 307—88.5)

This invention pertains to pulse counters, and particularly to a binary pulse counter for trigger pulses of long or varying duration.

A binary pulse counter typically comprises a pair of amplifiers which have their input and output terminals cross-connected to form a regenerative feedback loop which renders one amplifier conducting and the other nonconducting. Successive trigger pulses applied alternately to each amplifier cause both to successively interchange their operating states, the output voltage of the conducting amplifier being at one level and the output voltage of the nonconducting amplifier being at a second level. Assemblies of large numbers of such counters are frequently used in digital computing equipment. Since the trigger pulses are usually supplied from a single source, steering arrangements are used to direct the pulses alternately to the two counter amplifiers. In one such arrangement a pair of diodes connect the amplifier output terminals to the trigger pulse source. The voltages at those terminals then so bias the diodes that only one conducts in response to a trigger pulse, thus directing the pulse solely to the output terminal of the amplifier to which that diode is connected.

A major problem presented by this type of pulse steering circuit is that while the counter amplifiers are in the process of interchanging their states in response to a trigger pulse their output voltages momentarily become equal. This equalizes the bias voltages applied to both diodes, so that if the pulse is still present it is conveyed to both amplifiers and may cause them to revert back to their original states. To minimize the possibility of such erroneous operation, pulse delay means have been included in the amplifier cross-couplings to maintain the diode bias voltages substantially constant for a fixed interval exceeding the duration of each trigger pulse. While this technique is satisfactory when the trigger pulse duration is accurately established and of reasonable length, it is impractical when the duration is either very long or variable over a wide range. In addition, since the introduction of a delay in the amplifier cross-couplings reduces the speed with which the counter can change its state, the maximum trigger pulse repetition rate to which the counter can respond is materially reduced.

An object of the invention is to provide an improved trigger pulse steering circuit for a binary counter.

A further object is to provide a binary counter which will operate rapidly and reliably in response to trigger pulses having widely variable durations.

In accordance with the invention, the output terminals of a pair of pulse generators are respectively connected to the input terminals of the two amplifiers of a conventional binary counter. The input terminal of each pulse generator is connected to the output terminal of the associated amplifier, and is further connected to a source of clamping voltage. When the clamping voltage source is de-energized, the voltage at the output terminal of the amplifier which is in the first of the two mutually opposite operating states of both amplifiers prepares the pulse generator connected thereto to produce a switching pulse. However, the generator does not actually produce such a pulse until the clamping voltage source is energized by application of a trigger voltage thereto. The switching pulse then produced is transmitted to the input terminal of the amplifier which is in the first operating state, causing it to switch to the second operating state and so also causing the other amplifier to switch from the second to the first operating state. The clamping voltage source remains energized while the trigger voltage is present, so that during that time neither pulse generator can be caused to produce another switching pulse. However, when the trigger voltage terminates, the clamping voltage source becomes de-energized and the amplifier which is then in the first operating state prepares the pulse generator connected thereto to produce a switching pulse when the next trigger voltage occurs. As a result of this mode of operation, the duration and repetition rate of the trigger voltages have little effect on the reliability of the counter.

A more detailed description of the invention is presented in the following specification with reference to the accompanying circuit diagram of a particular embodiment of a binary counter constructed in accordance with the invention.

The illustrated binary counter comprises a pair of p-n-p junction transistors Q1 and Q2 which are grounded at their emitters. The collector of transistor Q1 is connected to the input terminal of a diode 1 which has its output terminal connected to a resistor 3 in series with a direct voltage source of minus six volts relative to ground. The collector of transistor Q2 is connected to the input terminal of a diode 5 which has its output terminal connected to a resistor 7 in series with the same source of minus six volts. The base of transistor Q1 is connected to the output terminal of diode 5 by a cross-coupling comprising a resistor 9 in parallel with a capacitor 11. Similarly, the base of transistor Q2 is connected to the output terminal of diode 1 by a cross-coupling comprising a resistor 13 in parallel with a capacitor 15. The bases of transistors Q1 and Q2 are further respectively connected by a pair of resistors 17 and 18 to a direct voltage source of plus six volts to ground.

A diode 19 is connected at its input terminal to the base of transistor Q1, the output terminal of diode 19 being connected to the collector of a third p–n–p junction transistor Q3. A second diode 25 similarly connects the base of transistor Q2 to the collector of a fourth p–n–p junction transistor Q4. The collectors of transistors Q3 and Q4 are also respectively connected to the minus six volts source by resistors 21 and 22. The emitters of transistors Q3 and Q4 are grounded, and their bases are respectively connected to the minus six volts source by resistors 29 and 31. Accordingly, the base of each of these transistors is biased negatively relative to its emitter, causing saturation current to flow between the emitter and collector. Since the collector-to-emitter impedance of a saturated junction transistor is very small, the collector voltage of each of transistors Q3 and Q4 will be close to ground potential. The base of transistor Q3 is further connected to one terminal of a capacitor C1, the other capacitor terminal being connected in common to the output terminals of a pair of diodes 33 and 34 and to a resistor 35 in series with the minus six volts source. The base of transistor Q4 is connected to another capacitor C2 which is similarly connected to a pair of diodes 37 and 38 and to a resistor 39 in series with the minus six volts source. The input terminals of diodes 33 and 37 are respectively connected to the collectors of transistors Q1 and Q2, and the input terminals of diodes 34 and 38 are connected together to the collector of a fifth p–n–p junction transistor Q5, A trigger voltage comprising a series of pulses 41 which are alternately positive and negative with respect to ground may be applied to the binary counter at input terminal 43 connected to the base of transistor Q5. Of course, if the supplied trigger pulses should be all negative or all positive with respect to the ground level of the counter, the required polarity relationship may be established by applying a suitable bias voltage to the base of transistor Q5. The emitter of transistor Q5 is grounded, so that while the trigger voltage is positive that transistor remains nonconducting. However, when the trigger voltage becomes negative transistor Q5 will conduct saturation current and hold its collector close to ground potential.

The operation of the circuit will be explained from as assumed starting condition wherein transistor Q1 is conducting saturation current, or is in the "on" state, and transistor Q2 is nonconducting or is in the "off" state. It will be further assumed that the trigger voltage at input terminal 43 is positive, so that transistor Q5 is also "off." Since the collector of transistor Q1 is then close to ground potential, diode 33 is subjected to a forward bias which causes it to conduct to hold the potential at the left-hand terminal of capacitor C1 substantially at ground. At the same time, as explained above, transistor Q3 is conducting saturation current. In view of the fact that the voltage drop between the emitter and base of a saturated transistor is very small, and since the emitter of transistor Q3 is grounded, the base of that transistor and the right-hand terminal of capacitor C1 connected thereto will be nearly at ground potential. Accordingly, capacitor C1 does not develop any appreciable charge and the voltage drop across it is virtually zero. The potential at the base of transistor Q1 is derived from the series path comprising resistors 7, 9 and 17 between the minus six volts source and the plus six volts source, so that the sizes of those resistors can be chosen to tend to establish that potential at a negative level somewhat beyond that required to maintain transistor Q1 in the "on" state. Of course, when transistor Q1 is "on," the low resistance between its base and emitter will prevent the potential at the base from becoming more than slightly negative. Diode 19 is thereby subjected to a net voltage which either back-biases it or subjects it to a sufficiently small forward bias so that its resistance is adequate to isolate the base of transistor Q1 from the collector of transistor Q3.

Since the collector of transistor Q1 is near ground potential, the potential at the output terminal of diode 1 is also near ground. This causes the voltage at the base of transistor Q2 to tend to reach a positive level established by the voltage division across resistors 13 and 18 in series between the plus six volts source and the output terminal of diode 1. Diode 25 connecting the base of transistor Q2 to the collector of transistor Q4 will therefore conduct, limiting the actual base voltage to the small conducting voltage drop across the diode. While that voltage drop may be only a few tenths of a volt, it maintains the base of transistor Q2 sufficiently positive relative to the grounded emitter to keep that transistor in the "off" state. No current can then flow through diode 37 connected to the collector of transistor Q2, so that the right-hand terminal of capacitor C2 is charged by the minus six volts source through resistor 39 to a potential of minus six volts. The left-hand terminal of that capacitor is held near ground potential by the saturated condition of transistor Q4, the potential at the base of that transistor then being substantially the same as that at its emitter. A charge of about six volts is therefore developed on capacitor C2.

Completing the description of this condition of the illustrated circuit, since the output terminal of diode 37 is at minus six volts, its input terminal and the collector of transistor Q2 connected thereto will be held at minus six volts. Although the voltage drop across resistor 7 caused by current flowing therein to the minus six volts source will produce a voltage at the output terminal of diode 5 which is more positive than minus six volts, diode 5 will thereby be back-biased to isolate the voltage at its output terminal from the collector of transistor Q2. The voltage at the collector of the input transistor Q5 will also be at minus six volts, being held there by virtue of its connection to the right-hand electrode of capacitor C2 by diode 38. Diode 34 serves to isolate the negative collector voltage of transistor Q5 from the small potential existing at the left-hand terminal of capacitor C1.

The foregoing operating condition will exist as long as the trigger voltage at input terminal 43 remains positive. When it does finally become negative, transistor Q5 will turn "on" and the voltage at its collector will rise close to ground level. Via diodes 34 and 38, the voltages at the left-hand terminal of capacitor C1 and the right-hand terminal of capacitor C2 are then clamped near ground. Since the left-hand terminal of capacitor C1 was already nearly at ground potential, virtually no voltage change occurs at that point. However, since the right-hand terminal of capacitor C2 had been at minus six volts it undergoes a six volt rise in potential. This voltage rise is instantaneously communicated to the left-hand terminal of capacitor C2 to raise the latter from near ground to about plus six volts. The base of transistor Q4 is thereby rendered positive, causing that transistor to turn "off." As it does so, a negative switching voltage is produced at its collector by the voltage division across resistors 18 and 22 in series between the plus six volts and minus six volts sources, the resistance of resistor 18 being considerably larger than that of resistor 22. Via diode 25 this switching voltage renders the base of transistor Q2 negative, and so causes that transistor to turn "on." The resultant low impedance between the base and emitter then prevents the voltage at the base from becoming more than a few tenths of a volt negative, and so also limits the switching voltage to a small negative value. Once transistor Q2 has turned "on," the voltage at its collector sharply rises from minus six volts nearly to ground. This positive voltage is conveyed through diode 5 and by resistor 9 and capacitor 11 to the base of transistor Q1, causing it to turn "off." The collector of transistor Q1 then drops from about ground potential toward minus six volts, thus back-biasing diode 1 and causing the voltage at the output terminal thereof to assume a negative value which, via resistor 13 and capacitor 15, keeps the base of transistor Q2 negative. A regenerative multivibrator operation is therefore completed, terminating with transistor Q2 being held in the "on" state and transistor Q1 being held in the "off" state.

During the foregoing counter operation, capacitor C2 will discharge through the loop comprising resistor 31, the minus six volts source, ground, and diode 38. The voltage at its left-hand terminal therefore drops from plus six volts toward minus six volts. However, when that voltage reaches ground level, or very slightly below ground, transistor Q4 will again turn "on." The voltage at its base, and so also the voltage at the left-hand terminal of capacitor C2, will then be clamped close to ground potential. Since the right-hand terminal of capacitor C2 is also clamped close to ground potential by virtue of the conduction of input transistor Q5, that capacitor will be held in the discharged condition. The continued conduction of transistor Q5 as long as the trigger pulse remains at its negative level also clamps the potential at the left-hand terminal of capacitor C1 close to ground. That is, although the collector of transistor Q1 goes toward minus six volts when that transistor turns "off," diode 33 connected thereto will be back-biased to prevent application of that voltage to the left-hand terminal capacitor C1. The right-hand terminal of capacitor C1 will be held close to ground by the conduction of transistor Q3. Consequently, the circuit remains in a steady operating condition wherein transistor Q1 is "off," transistor Q2 is "on," and practically no charge is developed on either of capacitors C1 and C2. This condition will continue no matter how long the trigger voltage at input terminal 43 remains negative.

Suppose now that the trigger voltage again becomes positive. Since that was the assumed starting point in describing the operation of the illustrated circuit, this transition of the trigger voltage will mark completion of a single trigger pulse. Input transistor Q5 then returns to the "off" state, so that it no longer clamps the potentials at the left-hand terminal of capacitor C1 and the right-hand terminal of capacitor C2 at ground. Nevertheless, as transistor Q2 is now "on," its collector will be nearly at ground potential and via diode 37 will continue to clamp the right-hand terminal of capacitor C2 near ground. The charge on that capacitor therefore remains virtually zero. With regard to capacitor C1, however, as transistor Q1 is "off" diode 33 is back-biased and no clamping voltage is applied to the left-hand capacitor terminal. Consequently, that terminal assumes the potential of the minus six volts source to which it is connected by resistor 35, and substantially a six volt charge is developed on capacitor C1. Comparing this state of the circuit with that which existed before the trigger voltage at terminal 43 changed from a positive to a negative value, it is seen that the states of transistors Q1 and Q2 and the charges on capacitors C1 and C2 have been interchanged.

The voltage at the collector of each of transistors Q1 and Q2 successively varies between a value near ground and a value near minus six volts in response to successive trigger voltage pulses at input terminal 43, so that the voltage at either collector indicates the state of the counter at any instant. For that reason, the circuit output terminals 49 and 51 are respectively connected to those collectors.

Specific values of the resistors and capacitors in the illustrated circuit which have been found satisfactory are as follows:

| Resistor: | Kilohms |
|---|---|
| 3 | 4.7 |
| 7 | 4.7 |
| 9 | 3.9 |
| 13 | 3.9 |
| 17 | 22.0 |
| 18 | 22.0 |
| 21 | 4.7 |
| 22 | 4.7 |
| 29 | 47.0 |
| 31 | 47.0 |
| 35 | 10.0 |
| 39 | 10.0 |

| Capacitor: | Micromicrofarads |
|---|---|
| 11 | 1000 |
| 15 | 1000 |
| C1 | 110 |
| C2 | 110 |

The foregoing values, together with the previously identified supply voltages, are, of course, merely typical of a great variety of combinations of other values which would be equally satisfactory. In addition, while all transistors employed have been described as p-n-p junction transistors it is obvious that n-p-n junction transistors would be equally suitable so long as the polarities of all voltages and the directions of all diodes are reversed. In general, since transistors Q1 and Q2 serve as amplifiers, while transistors Q3, Q4 and Q5 basically serve as switches, analogous circuits utilizing other types of amplifiers and other types of switches may be constructed. These and many other modifications of the illustrated circuit will be obvious to those skilled in the binary counter art without departing from the teachings and scope of the invention of which that circuit is but one embodiment.

What is claimed is:

1. A binary counter comprising five transistors which each have an emitter, a collector and a base, equipotentential means connected to the emitter of each of said transistors for establishing a reference voltage level, each of said transistors being adapted to assume the conducting state when the voltage at its base has a predetermined polarity relative to said reference voltage level and to assume the nonconducting state when the voltage at its base has the opposite polarity relative to said reference voltage level, each of said transistors being further adapted when in the conducting state to hold the voltage at its collector substantially equal to that at its emitter, a pair of coupling impedances respecively cross-connecting the collector and base of the first of said transistors to the base and collector of the second of said transistors, a first pair of diodes joined in series opposition between the collector of said first transistor and the collector of the third of said transistors, a second pair of diodes joined in series opposition between the collector of said second transistor and the collector of said third transistor, means for applying a series of trigger voltages of alternating polarity relative to said reference level to the base of said third transistor, a pair of capacitors respectively connecting the bases of the fourth and fifth of said transistors to the junctions of said first and second pairs of diodes, a pair of sources of voltage of said predetermined polarity, resistive means respectively connecting the first of said sources to the junction of said first pair of diodes and to the base and collector of said fourth transistor, further resistive means respectively connecting the second of said sources to the junction of said second pair of diodes and to the base and collector of said fifth transistor, and additional diode means respectively connecting the collectors of said fourth and fifth transistors to the bases of said first and second transistors.

2. A binary counter comprising three transistors which each have an emitter, a collector and a base, equipotential means connected to the emitter of each of said transistors for establishing a reference voltage level, each of said transistors being adapted to assume the conducting state when the voltage at its base has a predetermined polarity relative to said reference voltage level and to assume the nonconducting state when the voltage at its base has the opposite polarity relative to said reference voltage level, each of said transistors being further adapted when in the conducting state to hold the voltage at its collector substantially equal to that at its emitter, a pair of coupling impedances respectively cross-connecting the collector and base of the first of said transistors to the base and collector of the second of said transistors, a first pair of diodes joined in series opposition between the collector of said first transistor and the collector of the third of said transistors, a second pair of diodes joined in series opposition between the collector of said second transistor and the collector of said third transistor, means for applying a series of trigger voltages of alternating polarity relative to said reference level to the base of said third transistor, a pair of transistor switching means which each have an input terminal, an output terminal and a control terminal, means for connecting the input terminals of said switching means to said equipotential means, each of said switching means being adapted to connect its output terminal to its input terminal when a voltage of said predetermined polarity is applied to its control terminal and to disconnect its output terminal from its input terminal when a voltage of said opposite polarity is applied to its control terminal, a pair of sources of voltage of said predetermined polarity, resistive means respectively connecting the first of said sources to the control and output terminals of the first of said switching means, further resistive means respectively connecting the second of said sources to the control and output terminals of the second of said switching means, a pair of capacitors respectively further connecting the control terminals of said first and second switching means to the junctions of said first and second pairs of diodes, and a third pair of diodes respectively further connecting the output terminals of said first and second switching means to the bases of said first and second transistors.

3. A binary counter comprising three transistors which each have an emitter, a collector and a base, equipotential means connected to the emitter of each of said transistors for establishing a reference voltage level, each of said transistors being adapted to assume the conducting state when the voltage at its base has a predetermined polarity relative to said reference voltage level and to assume the nonconducting state when the voltage at its base has the opposite polarity relative to said reference voltage level, each of said transistors being further adapted when in the conducting state to hold the voltage at its collector substantially equal to that at its emitter, a pair of coupling impedances respectively cross-connecting the collector and base of the first of said transistors to the base and collector of the second of said transistors, a first pair of diodes joined in series opposition between the collector of said first transistor and the collector of the third of said transistors, a second pair of diodes joined in series opposition between the collector of said second transistor and the collector of said third transistor, means for applying a series of trigger voltages of alternating polarity relative to said reference level to the base of said third transistor, a pair of sources of voltage of said predetermined polarity, a third pair of diode means respectively connecting the first of said sources to the base of said first transistor and the second of said sources to the base of said second transistor, first and second normally conducting transistor switching means respectively shunting said first and second sources to said equipotential means, each of said switching means having a control terminal at which application of a voltage of said opposite polarity renders that switching means nonconducting, and a pair of voltage storage means respectively connected at their input terminals to the junctions of said first and second pairs of diodes and at their output terminals to the control terminals of said first and second switching means, each of said voltage storage means being adapted to momentarily produce a voltage of said opposite polarity at its output terminal when the voltage at its input terminal is changed from one of said predetermined polarity to said reference voltage level.

4. A binary counter comprising a pair of transistor amplifiers which each have an input terminal and an output terminal, means for so cross-connecting the input terminal of each of said amplifiers to the output terminal of the other that one amplifier assumes a first operating state wherein the voltage of its output terminal is at a reference level and the other amplifier assumes a second operating state wherein the voltage at its output terminal is at a second level, first and second normally conducting transistors, a pair of voltage storage means respectively connected at their output terminals to the control terminals of said normally conducting transistors, a first pair of gating means respectively connecting the input terminal of each of said voltage storage means to the output terminal of a transistor amplifier, each of said first pair of gating means serving to apply a voltage at substantially said second level to the voltage storage means to which it is connected when the transistor amplifier to which it is also connected is in said second operating state, each of said voltage storage means serving to produce a pulse at its output terminal to cut off the normally conducting transistor to which it is connected when the potential at its input terminal is changed from said second level to a clamping voltage level, a second pair of gating means respectively connected to the input terminals of said voltage storage means, means for periodically applying clamping voltage pulses to said voltage storage means via said second pair of gating means, and a third pair of gating means respectively interconnected between the output terminals of said normally conducting transistors and the input terminals of said transistor amplifiers, said third pair of gating means serving to deliver to the input of said transistor amplifiers the pulse signals produced at the output of said normally conducting transistors when they are alternately cut-off, whereby the operating states of said transistor amplifiers are successively altered in response thereto.

References Cited in the file of this patent

UNITED STATES PATENTS

| | | |
|---|---|---|
| 2,545,924 | Johnstone | Mar. 20, 1951 |
| 2,596,741 | Tyler et al. | May 13, 1952 |
| 2,719,228 | Auerbach et al. | Sept. 27, 1955 |
| 2,774,868 | Havens | Dec. 18, 1956 |
| 2,808,203 | Geyer et al. | Oct. 1, 1957 |